United States Patent [19]
Schönberger et al.

[11] Patent Number: 5,965,843
[45] Date of Patent: Oct. 12, 1999

[54] DIAGONAL PRINTED CONDUCTOR CONNECTING METAL COATINGS OF TWO WALLS OF A BOX

[75] Inventors: Eduard Schönberger; Stefan Gruber, both of Kümmersbruck; Hermann Kasowski, Kastl; Heinz Schmidt, Kümmersbruck, all of Germany

[73] Assignee: Siemens AG, Germany

[21] Appl. No.: 08/911,508

[22] Filed: Aug. 14, 1997

Related U.S. Application Data

[63] Continuation of application No. 08/185,603, Jan. 21, 1994, abandoned.

[30] Foreign Application Priority Data

Jan. 22, 1993 [DE] Germany .................... 9300868

[51] Int. Cl.⁶ .................................................. H05K 9/00
[52] U.S. Cl. ..................... 174/35 R; 174/260; 361/818; 361/820
[58] Field of Search ................... 174/35 R, 35 GC, 174/35 MS, 250, 260; 361/816, 817, 818, 820, 821

[56] References Cited

U.S. PATENT DOCUMENTS

| 3,365,621 | 1/1968 | Von Fange et al. ............ 361/818 |
| 3,721,746 | 3/1973 | Knappenberger ............ 174/35 MS |
| 4,759,466 | 7/1988 | Chase et al. . |
| 4,837,664 | 6/1989 | Rodriguez, II et al. . |
| 4,860,162 | 8/1989 | DeVizzi . |
| 4,861,941 | 8/1989 | Kubo et al. ............ 174/35 R |
| 5,045,971 | 9/1991 | Ono et al. . |
| 5,105,095 | 4/1992 | Rudy, Jr. et al. . |
| 5,107,404 | 4/1992 | Tam . |
| 5,150,282 | 9/1992 | Tomura et al. . |
| 5,229,545 | 7/1993 | Good . |
| 5,252,782 | 10/1993 | Cantrell et al. . |
| 5,271,887 | 12/1993 | Wiech, Jr. . |
| 5,285,010 | 2/1994 | Huber . |
| 5,297,007 | 3/1994 | Deyo et al. ............ 361/207 |
| 5,407,622 | 4/1995 | Cleveland et al. . |
| 5,422,433 | 6/1995 | Rivera et al. ............ 174/35 GC |
| 5,432,676 | 7/1995 | Saloh et al. . |
| 5,451,722 | 9/1995 | Gregoire . |
| 5,523,921 | 6/1996 | Van Lydegraf ............ 361/818 |
| 5,604,668 | 2/1997 | Wohrstein et al. ............ 361/816 |
| 5,706,170 | 1/1998 | Glovatsky et al. ............ 361/695 |

FOREIGN PATENT DOCUMENTS

| 0 306 412 | 3/1987 | European Pat. Off. . |
| 0 465 692 | 1/1992 | European Pat. Off. . |
| 33 25 360 | 1/1985 | Germany . |

*Primary Examiner*—Kristine Kincaid
*Assistant Examiner*—Kamand Cuneo
*Attorney, Agent, or Firm*—Kenyon & Kenyon

[57] ABSTRACT

An injection-molded part (1) includes elevations (2) and/or depressions (12) arranged between integrated printed conductors (4). If the elevations (2) or depressions (12) are uncoated and thus electrically insulating, they increase the effective voltage clearances between the printed conductors (4) and the components (3) arranged next to the printed conductors (4). The geometric distances can then be reduced. Alternatively, by electroconductively coating the elevations (2), electric and magnetic shielding is achieved in a simple manner. A cover (6) is provided as a top of a box which uses elevations (2) as side walls. A tapering portion (5) connects coatings (7,7') of the cover (6) and elevations (2) via a printed conductor (8) running diagonally across the tapering portion (5).

4 Claims, 2 Drawing Sheets

DIAGONAL PRINTED CONDUCTOR CONNECTING METAL COATINGS OF TWO WALLS OF A BOX

This application is a continuation of application Ser. No. 08/185,603, filed Jan. 21, 1994, now abandoned.

BACKGROUND OF THE INVENTION

The present invention relates to a one-piece insulating part such as a plastic one-piece insulating part. More particularly, the present invention relates to an injection-molded part having at least one plastic-part side on which at least two printed conductors are arranged.

An insulating part is disclosed, for example, in European Patent Document No. EP-O 465 692 A1. The type of insulating part disclosed in this reference is also used as a rear panel for a housing in the case of a programmable controller (SIMATIC S5-95 U) of Siemens AG.

When higher voltages (for example, 230 V) are used, it is necessary to space the printed conductors relatively far apart from one another in order to adhere to prescribed voltage clearances between adjacent printed conductors and soldering eyes. Therefore, due to electrical safety codes, the circuit substrate can only be utilized to a considerably lesser extent than would otherwise be allowed by component-inserting or printed-circuit engineering. Consequently, it would be beneficial to enable components, printed conductors, and soldering eyes to be arranged more closely together in order to better utilize the available space.

Furthermore, in the case of electronic modules, the problem of electric shielding arises, either with respect to emitted or immitted electromagnetic spurious radiation. Therefore, a need has arisen in order to develop a way to simply shield modules or module parts.

SUMMARY OF THE INVENTION

The present invention enables components, conductors (e.g., printed conductors), and soldering eyes to be arranged more closely together to better utilize the available space while still adhering to prescribed voltage clearances between adjacent conductors (e.g., printed conductors) and soldering eyes. This is accomplished according to an embodiment of the present invention in which the insulating part between the conductors (e.g., printed conductors) has an elevation (for example, a rib) and/or a depression (for example, a groove) with sides facing the conductors, the elevation being free of electrically conductive coatings. In this manner, the effective distance between two conductors is increased considerably so that the direct distance between the conductors can be reduced without any loss of safety.

The present invention additionally allows a shielding of modules or module parts. This is accomplished according to an embodiment of the present invention in which the insulating part between the conductors has an elevation (for example, a rib) with sides facing the printed conductors, at least one of the sides having an electrically conductive coating. The electrically conductive coating achieves a shielding of the two conductors (e.g., printed conductors), of the components arranged on the two conductors, of the components arranged on the two conductors, or generally of the regions of the insulating-part side that are isolated from one another by the elevation. Additionally, a cover (e.g., a further elevation) may be provided as a top of a box using the elevations as side walls of the box. A portion (e.g., a tapering portion) which may act as a film hinge may be used which connects electrically conductive coatings of the cover and elevations via a conductor running diagonally across the tapering portion.

BRIEF DESCRIPTION OF THE DRAWINGS

Further advantages and details of the present invention are revealed in the subsequent description of an exemplified embodiment in conjunction with the attached drawings.

DETAILED DESCRIPTION

Figure 1:
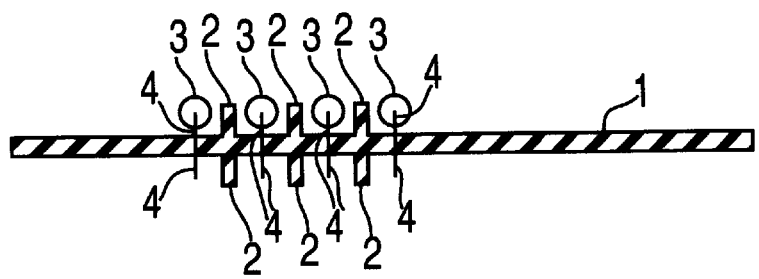
FIG. 1 illustrates a plastic part having uncoated elevations.

FIG. 1 illustrates a one-piece injection-molded part 1 including several elevations or oblong ribs 2 which are free of electrically conductive coatings. Electronic components 3 (for example, resistors, soldering eyes, and conductors (e.g., printed conductors) 4) run between the oblong ribs 2. In this manner, the effective distance between adjacent components 3 or adjacent conductors (e.g., printed conductors) 4 is enlarged, so that the conductors 4 and the components 3 can be arranged close to one another in spite of operation of a circuit arrangement with a high voltage (for example, 230 V).

Figure 4:
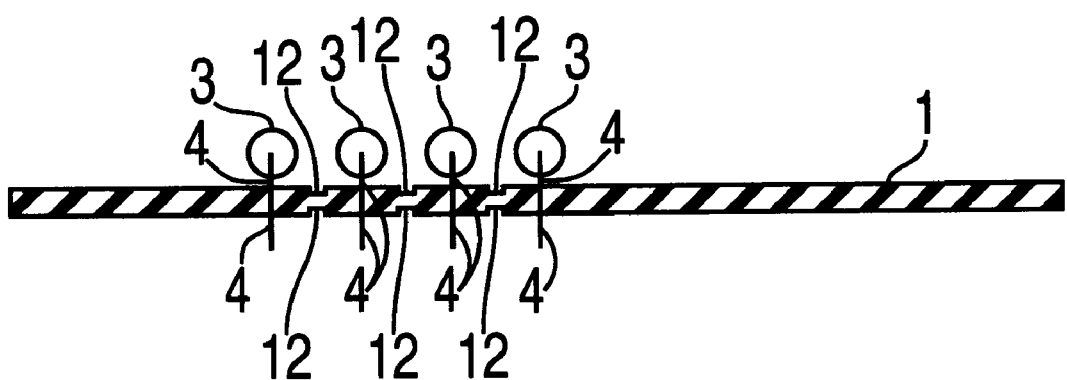
FIG. 4 illustrates a second embodiment of a plastic part, the plastic part having depressions.

The oblong ribs 2 illustrated in FIG. 1 are preferably not metallically coated. However, in place of a rib 2 that is not metallically coated, as illustrated in FIG. 4 a depression or groove 12 that is also not metallically coated can be arranged between the conductors 4, since the prescribed clearance is considerably smaller than the prescribed creepage distance effected by the depression or groove 12.

Figure 2:
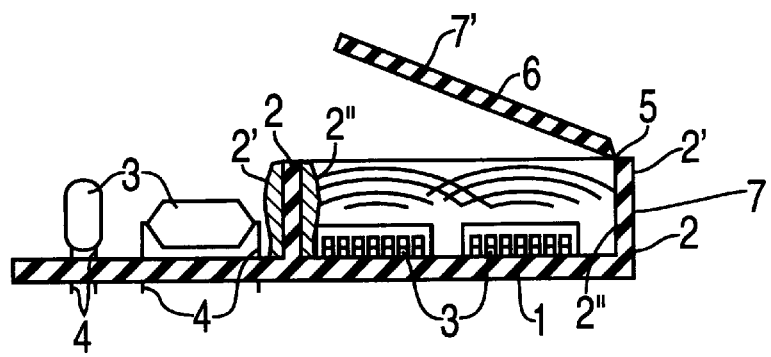
FIG. 2 illustrates a plastic part having electrically conductive, coated elevations.

The injection-molded part 1 illustrated in FIG. 2 also has a one-piece design and includes ribs 2. Each of the ribs 2 includes two printed-conductor sides 2', 2". On at least one of the sides 2', 2" (for example, on the side 2'), the rib 2 has an electrically conductive coating 7. By means of this coating, the circuit situated between the ribs 2 is shielded from its surroundings.

The shielding action is particularly effective when it is provided on all sides. To this end, the injection-molded part has a circumferential rib 2, as depicted in FIG. 2, so that the rib 2 forms the side walls of a box. A cover 6, which closes the box on the top, is joined by way of a portion 5 (e.g., a tapering portion) to the rib 2. The bottom of the box is formed by the base of the plastic part 1 itself.

Figure 3:
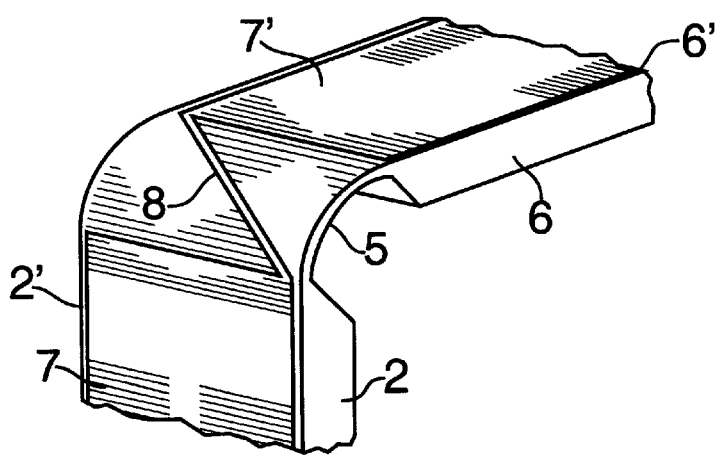
FIG. 3 illustrates detail of an elevation illustrated in FIG. 2.

In accordance with FIG. 3, both the exterior side 2' of the rib 2 as well as the exterior 6' of the cover 6 are provided over a large area (e.g., large flat surface area as shown in FIG. 3) with metal coatings 7, 7'. The coatings 7, 7' are interconnected via a printed conductor 8 that runs diagonally across the portion 5. Because the coatings 7, 7' are joined diagonally, the conductor (e.g., printed conductor) 8 is not interrupted when the cover 6 is actuated. Such an interruption could occur, if the conductor 8 and the coatings 7, 7' were joined together over the shortest possible path. However, as an alternative to the diagonally running conductor 8, a completely metallized portion 5 could be used.

In conclusion, the injection-molded part 1 according to an embodiment of the present invention is first injection-molded in a generally known way, and then metallically coated over a large area in a likewise generally known way.

The conductors 4, 8, as well as the uncoated elements are formed by removing the metal layer from the places where it is not wanted.

Furthermore, in place of an injection-molded part, a one-piece circuit substrate may be used that is initially electrically insulating on its surface, for example an aluminum die-cast part that is suitably anodized over its entire surface.

What is claimed is:

1. An arrangement comprising:

a plastic part including several sides;

at least two conductors arranged on one side of the plastic part; and an elevation portion arranged on the one side of the plastic part, the elevation portion being located between two of the at least two conductors, the elevation portion including a first side facing one of the at least two conductors and a second side facing another one of the at least two conductors, wherein at least one of the first and second sides of the elevation portion has a first electrically conductive coating, the elevation portion further including;

a base that is joined directly to the one side of the plastic part, and a cover being joined to the elevation portion by a connection portion serving as a hinge, wherein the base has a second electrically conductive coating provided over a large area thereof, wherein the cover has a third electrically conductive coating provided over a large area thereof, and wherein the coating of one of the second and third electrically conductive coatings is joined to another one of the second and third electrically conductive coatings by a conductor extending diagonally across the connection portion.

2. An arrangement, comprising:

a plastic part including several sides;

at least two conductors arranged on one side of the plastic part;

an elevation portion arranged on the one side of the plastic part between two of the at least two conductors, the elevation portion including:

two elevation sides facing towards the two of the at least two conductors, at least one of the two elevation sides having a first electrically conductive coating, a base joined directly to the one side of the plastic part;

a cover joined directly to the base via a connecting portion which serves as a hinge, wherein the base has a second electrically conductive coating over a large area thereof, wherein the cover has a third electrically conductive coating over a large area thereof, and wherein one of the second and third electrically conductive coatings is joined to another one of the second and third electrically conductive coatings by a conductor extending diagonally across the connecting portion.

3. The arrangement according to claim 2, wherein the plastic part has a metal core with a plastic portion being an insulating layer on the metal core.

4. The arrangement according to claim 3, wherein the metal core is an anodized, aluminum die-cast part.

* * * * *